US008330560B2

(12) United States Patent
Matsudo

(10) Patent No.: US 8,330,560 B2
(45) Date of Patent: Dec. 11, 2012

(54) TUNING-FORK TYPE CRYSTAL RESONATOR AND METHOD OF FREQUENCY ADJUSTMENT THEREOF

(75) Inventor: Hideryo Matsudo, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 309 days.

(21) Appl. No.: 12/452,655

(22) PCT Filed: Jul. 23, 2008

(86) PCT No.: PCT/JP2008/063610
§ 371 (c)(1),
(2), (4) Date: Apr. 19, 2010

(87) PCT Pub. No.: WO2009/020015
PCT Pub. Date: Feb. 12, 2009

(65) Prior Publication Data
US 2010/0207709 A1 Aug. 19, 2010

(30) Foreign Application Priority Data

Aug. 6, 2007 (JP) .................................. 2007-204425
Jul. 22, 2008 (JP) .................................. 2008-188414

(51) Int. Cl.
*H03H 9/02* (2006.01)
*H01L 41/08* (2006.01)
(52) U.S. Cl. ........................................ 333/200; 310/370
(58) Field of Classification Search .................. 333/186, 333/200; 310/370
See application file for complete search history.

(56) References Cited

U.S. PATENT DOCUMENTS 3,683,213 A * 8/1972 Staudte ......................... 310/312
7,368,861 B2 * 5/2008 Tanaya ......................... 310/370
7,637,159 B2 * 12/2009 Yamamoto et al. ......... 73/504.16

FOREIGN PATENT DOCUMENTS

| JP | 2000-278066 | 10/2000 |
| JP | 2004-201105 | 7/2004 |
| JP | 2004-289237 | 10/2004 |
| JP | 2007-057411 | 3/2007 |

OTHER PUBLICATIONS

International Search Report of PCT/JP2008/063610 mailed by the International Search Authority on Sep. 9, 2008.

* cited by examiner

*Primary Examiner* — Dean O Takaoka
(74) *Attorney, Agent, or Firm* — Edwards Wildman Palmer LLP; Scott D. Wofsy

(57) ABSTRACT

The invention relates to a tuning-fork type crystal resonator in which the frequency adjustment accuracy is increased, and a frequency adjustment method thereof. In a tuning-fork type crystal resonator having a tuning-fork shaped piece of quartz crystal in which a pair of tuning fork arms extend from a tuning fork base, and a frequency adjustment method thereof, there is provided a first frequency adjustment step for adjusting an oscillation frequency by forming inclined surfaces spanning from outer peripheral surfaces surrounding the pair of tuning fork arms toward distal end surfaces, by using a femtosecond laser irradiated in a direction from the outer peripheral surfaces toward the distal end surfaces, or in a direction from the distal end surfaces toward the outer peripheral surfaces.

4 Claims, 7 Drawing Sheets

TUNING-FORK TYPE CRYSTAL RESONATOR AND METHOD OF FREQUENCY ADJUSTMENT THEREOF

TECHNICAL FIELD

The present invention relates to a tuning-fork type crystal resonator (referred to hereunder as a "tuning-fork type resonator") and a method of adjustment of the oscillation frequency thereof. In particular, it relates to a method of frequency adjustment of a tuning-fork type resonator in which the adjustment accuracy is increased.

BACKGROUND ART

1. Background of the Invention

Tuning-fork type resonators are especially used as reference sources for clocks, and are built into not only watches but also electronic equipment such as portable telephones, digital cameras, and the like as parts providing a clock function. In recent years, as such electronic equipment has become widespread and small sized, tuning-fork type resonators have also been formed by etching using photolithography.

2. Prior Art

FIG. 4 is a plan view of an example of a conventional tuning-fork type resonator, viewed with its lid removed. Furthermore, FIG. 5A and FIG. 5B are diagrams of the tuning-fork type resonator described in detail. In particular, FIG. 5A is a perspective view of the tuning-fork type resonator, including the electrode wiring, and FIG. 5B is a cross-sectional diagram showing a cross-section through line A-A of FIG. 5A with an oscillator circuit.

As shown in FIG. 4, the example of a conventional tuning-fork type resonator is provided with a tuning fork shaped quartz crystal piece 3 with a pair of tuning fork arms 2a and 2b extending from a tuning fork base 1. The two tuning fork arms 2a and 2b have excitation electrodes 4 on each of their four surfaces excluding the distal end surfaces (head surfaces). As shown in FIG. 5B, all of the excitation electrodes 4 are connected. That is, they are connected such that the electric potentials between each of the two main surfaces and between each of the two side surfaces in the respective tuning fork arms 2a and 2b are the same, those between the two side surfaces and the two main surfaces are reversed, and the electric potentials between the two main surfaces and between the two side surfaces of the tuning fork arms 2a and 2b are reversed relative to each other.

Excitation electrodes 4 with the same potentials are connected together, and as shown in FIG. 5A, a pair of electrodes extends to the bottom of the main surfaces of the tuning fork base 1. Normally, as shown in FIG. 4, metal films 5a and 5b for frequency adjustment are formed on the main surfaces on the tip sides of the tuning fork arms 2a and 2b. Then these, including the excitation electrodes 4 and the like are outline machined by etching using photolithography, for example, and many tuning fork shaped quartz crystal pieces 3 are connected integrally on a quartz crystal wafer 9 as shown in FIG. 2, which is described later.

After being divided into individual tuning-fork shaped quartz crystal pieces from the quartz crystal wafer 9 as shown in FIG. 2, the bottom of the main surface of the tuning fork base 1 of a tuning-fork shaped quartz crystal piece 3 is fixed to inner wall pad sections 7 at one end of a surface mount housing (enclosure) 6 having a concave cross-section, which provides terminals to the quartz crystal, and is connected electrically and mechanically. The open end surface of the surface mount housing (enclosure) 6 is sealed by a lid (not shown in the figure), and the tuning-fork shaped quartz crystal piece 3 is sealed in. Normally, this is a vacuum seal, which limits the increase in crystal impedance (CI) caused by miniaturization.

With this device, in a state in which the tuning-fork shaped quartz crystal pieces 3 are connected integrally on the quartz crystal wafer 9, parts of the metal films 5a and 5b on the main surfaces of the tips are removed by melting and dispersing using a laser such as a YAG or the like. Then, the oscillation frequencies of the tuning-fork type resonators (tuning-fork shaped quartz crystal pieces 3) are adjusted from low to high. In this case, since the frequency of the tuning-fork type resonators can be adjusted at a quartz crystal wafer level collectively, it is possible to increase the productivity.

Alternatively, the frequency of the tuning-fork type resonator may be adjusted by removing parts of the metal films 5a and 5b, similarly, after the tuning-fork shaped quartz crystal piece 3 is housed in the surface mount housing (enclosure) 6. In this case, the oscillation frequency at room temperature can be adjusted within the specification allowing for the change in the oscillation frequency when the tuning fork base 1 is fixed on the pad sections 7. Furthermore, it is also possible to adjust the oscillation frequency finely after adjusting the oscillation frequency of each of the tuning-fork shaped crystal pieces 3 roughly in a quartz crystal wafer 9 state, and separating them into individual pieces to be housed in the surface mount housings (enclosures) 6.

Moreover, there is another method in which characteristic adjustment is performed by gradually cutting off the outer corners of the oscillation arm parts of the tuning-fork type quartz crystal piece using a laser light with a wavelength suitable for cutting quartz crystal.

(Refer to Japanese Unexamined Patent Publication No. 2004-201105, Japanese Unexamined Patent Publication No. 2004-289237, Japanese Unexamined Patent Publication No. 2007-57411, and Japanese Unexamined Patent Publication No. 2000-278066)

Problems in the Prior Art

However, in the conventional tuning-fork type resonator with the above-described construction, since the metal films 5a and 5b for frequency adjustment need to be formed at the tips of the tuning fork arms 2a and 2b, the manufacturing process becomes complicated. At the time of frequency adjustment, since the metal films 5a and 5b are removed by the heat of a laser, the temperature of the tuning fork arms 2a and 2b themselves (tuning-fork type resonator itself) also increases. The frequency-temperature characteristics of a tuning-fork type resonator follow a quadratic function with the maximum being in the vicinity of room temperature.

Therefore, even if the frequency of the tuning-fork type resonator is adjusted at room temperature, the frequency adjustment is actually performed at a higher temperature than room temperature due to the increase in the temperature of the tuning fork arms 2a and 2b. As a result, the frequency adjustment is inadequate, so there is a problem in that the adjustment accuracy is likely to fall.

FIG. 6 is a diagram to demonstrate the problem, and is a diagram showing a typical example of the frequency-temperature characteristics of a tuning-fork type resonator. It shows a diagram of the frequency-temperature characteristics of a tuning-fork type resonator with the horizontal axis being temperature, and the vertical axis being the frequency variation amount (units: ppm) with respect to room temperature at each temperature.

A tuning-fork type resonator is normally designed such that the peak is in the vicinity of a temperature of 25° C. (the temperature coefficient becomes flat). Furthermore, the frequency adjustment accuracy is required to be within ±20 ppm. However, as described above, in the case where the metal film is removed by the heat of a laser, at the time of laser irradiation the quartz crystal reaches a considerable temperature (at least 100° C. or greater). Therefore, since the frequency variation becomes a value in the region at 100° C. or greater in FIG. 6, it becomes several 100 ppm lower than that at room temperature. Accordingly, when the laser adjustment is completed, and the quartz crystal cools down, the frequency shifts upwards. As a result, the frequency at the time of frequency adjustment cannot be maintained, so that the specified frequency adjustment accuracy cannot be ensured.

Moreover, as another problem, the frequency adjustment range is limited by the thickness of the metal films 5a and 5b. That is, since a YAG laser can only remove the metal films, then after removing the metal films, the frequency of the quartz crystal oscillator cannot be adjusted. Accordingly, there is a natural limit to the frequency adjustment range. Therefore, it is necessary to reduce the frequency distribution after the external appearance of the tuning fork is formed using photolithography, and as a result, there are considerable manufacturing restrictions.

Objects of the Invention

The present invention has objects of providing a tuning-fork type crystal resonator in which the frequency adjustment accuracy is increased, and a method of frequency adjustment thereof.

DISCLOSURE OF THE INVENTION

The present invention is a method of frequency adjustment of a tuning-fork type crystal resonator having a tuning-fork shaped piece of quartz crystal in which a pair of tuning fork arms extend from a tuning fork base, comprising a first frequency adjustment step for adjusting an oscillation frequency by forming inclined surfaces spanning from outer peripheral surfaces surrounding the pair of tuning fork arms toward distal end surfaces, by using a femtosecond laser irradiating in a direction from the outer peripheral surfaces toward the distal end surfaces, or in a direction from the distal end surfaces toward the outer peripheral surfaces.

Effects of the Invention

Using such a construction, since a femtosecond laser [ultrashort pulse laser: 1 femtosecond ($10^{-15}$ seconds)] is used, it is possible to cut off the tip surfaces of the pair of tuning fork arms directly. Accordingly, frequency adjustment is theoretically possible provided the quartz crystal itself can be cut, so that the frequency adjustment range can be widened compared with the case of removing a metal film. Moreover, since a metal film does not need to be used for frequency adjustment, the metal film [typically a gold (Au) film] conventionally required is unnecessary, so that it is also possible to eliminate a metal film forming process and reduce the metal material cost. Furthermore using a femtosecond laser (ultrashort pulse laser) has little thermal impact on a piece of quartz crystal, so that effectively no temperature increase occurs at the time of frequency adjustment. That is to say, in a femtosecond laser, the laser pulse width is so narrow that laser irradiation ends before heat transfer to the periphery of the laser irradiation position occurs. Therefore a temperature increase at the time of frequency adjustment of the tuning fork shaped quartz crystal piece can be prevented. As a result, the accuracy of the frequency adjustment of the tuning-fork type resonator can be further increased.

Moreover, since a femtosecond laser is irradiated from the outer peripheral side surfaces of a pair of tuning fork arms to the distal end surfaces or from the distal end surfaces to the outer peripheral side surfaces, at the time of irradiation, the femtosecond laser permeates the tuning fork arms in a diagonal direction. Therefore, energy due to the femtosecond laser is not confined inside of the quartz crystal piece, so that it is possible to prevent or reduce cracking of the quartz crystal piece.

In contrast, in the case where a femtosecond laser is incident on the main surfaces of the tuning fork arms vertically, the energy of the femtosecond laser is likely to be confined inside of the quartz crystal piece, which causes cracking in the quartz crystal, and damages the inside of the quartz crystal.

In the present invention, the outer peripheral surface is the main surface of the tuning fork arm. As a result, it is possible to adjust the frequency easily with the tuning-fork shaped quartz crystal pieces 3 in a quartz crystal wafer 6 state or after each of the tuning-fork shaped quartz crystal pieces 3 is housed in the surface mount housing (enclosure) 6 having a concave cross-section.

Furthermore, in the present invention, an oscillation frequency is adjusted in a state in which the tuning-fork shaped quartz crystal pieces are outline machined using etching, and they are connected integrally on a quartz crystal wafer. As a result, frequency adjustment is performed collectively at the quartz crystal wafer level, which makes the adjustment efficient.

Moreover, in the present invention, the tuning-fork shaped quartz crystal piece has an adjustment metal film on a main surface on a tip side of the tuning fork arm, and there is provided a second frequency adjustment step for removing part of the adjustment metal film using a laser, after the first frequency adjustment step using the femtosecond laser.

This enables highly accurate frequency adjustment of a crystal oscillator by performing frequency adjustment of the tuning-fork type resonator by rough adjustment in the first frequency adjustment and fine adjustment in the second frequency adjustment.

Furthermore, in the present invention, the first frequency adjustment step is executed in a state in which the tuning-fork shaped quartz crystal pieces are connected integrally on a quartz crystal wafer, and the second frequency adjustment step is executed in a state in which they are each housed in a surface mount housing (enclosure) having a concave cross-section. As a result, since rough adjustment in the first frequency adjustment step can be performed in a quartz crystal wafer state collectively, the frequency adjustment becomes efficient.

Moreover, in the present invention, the laser used in the second frequency adjustment step is a femtosecond laser with lower power than the laser power of the first frequency adjustment step. As a result, the laser equipment in the first frequency adjustment step can be used in the second frequency adjustment step, and fine adjustment can be performed with a lower heating effect.

In the present invention, the first frequency adjustment step irradiates the femtosecond laser continuously while executing frequency measurement of the tuning-fork shaped piece of quartz crystal (that is to say, while measuring the frequency with a frequency measuring probe contacted against the tuning-fork shaped piece of quartz crystal). The reason for doing it this way is in order to positively utilize the characteristics of the femtosecond laser, in that with the femtosecond laser, the laser pulse width is so narrow that laser irradiation ends before heat transfer occurs. By measuring the frequency while irradiating the femtosecond laser continuously, frequency measurement is performed moment by moment. Therefore, frequency adjustment accuracy can be increased compared to the conventional case of using the YAG laser.

Furthermore, in the present invention, an incident angle with respect to a main surface of the tuning fork, of the femtosecond laser that forms the inclined surfaces is 30 to 70°. In a case where the femtosecond laser is vertically incident, the laser light shines into the interior of the quartz crystal. If this happens, laser damage is likely to occur. With inclined irradiation, the laser light can easily cut the side surface, but is unlikely to shine into the interior of the quartz crystal, and hence damage to the interior of the quartz crystal can be prevented.

In the second frequency adjustment step, a construction is described in which a metal film is removed. However, the arrangement may be such that adjustment is performed by cutting the quartz crystal using a femtosecond laser light with lower power than the power at the time of the first frequency adjustment step.

Here the pulse width of the femtosecond laser used in the present invention is preferably less than or equal to 500 fs (femtoseconds), more preferably less than or equal to 200 fs, and further preferably less than or equal to 100 fs. The shorter the pulse width, the more significant the effect of using the femtosecond laser, and thermal damage can be reduced. Furthermore, the effect of the present invention can be obtained with the power of the femtosecond laser being several µJ/pulse to several 10 µJ/pulse. Moreover, since the femtosecond laser is a pulsed laser, the pulse repetition frequency is also an important parameter. The pulse repetition frequency may be several 100 Hz, preferably 500 Hz or more, and more preferably 1000 Hz or more. With a higher pulse repetition frequency of the femtosecond laser, the number of irradiation pulses per unit time can be increased making it possible to shorten the time for frequency adjustment.

Furthermore, in the present invention, the femtosecond laser is irradiated diagonally from the outer peripheral surface surrounding the tuning fork arms toward the distal end surfaces, or from the distal end surfaces toward the outer peripheral surfaces, in order to form inclined surfaces extending from the tuning fork outer peripheral surface to the distal end surfaces. The angle of diagonal irradiation (incident angle with respect to the tuning fork main surfaces) is preferably 30° to 70°, more preferably 40° to 70°, and further preferably 45° to 60°, but is not limited to this.

BRIEF DESCRIPTION OF THE DRAWINGS

FIG. 1 shows an embodiment of a frequency adjustment step of a tuning-fork type resonator of the present invention, wherein

FIG. 5 shows the tuning-fork type resonator in detail, wherein

BEST MODE FOR CARRYING OUT THE INVENTION

Figure 1A:
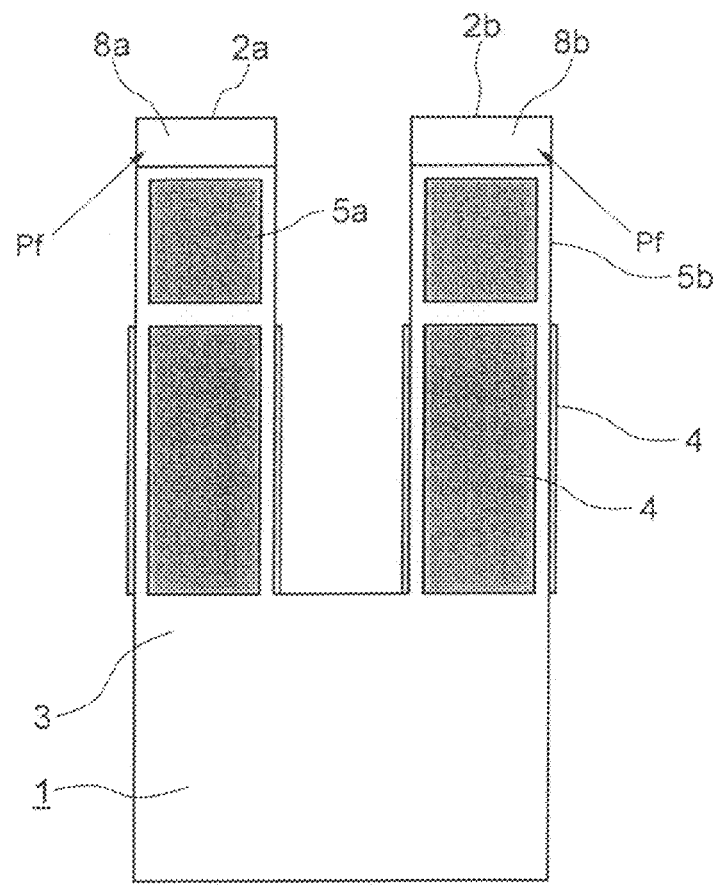
FIG. 1A is a front view of a tuning-fork shaped quartz crystal piece 3.
Figure 1B:
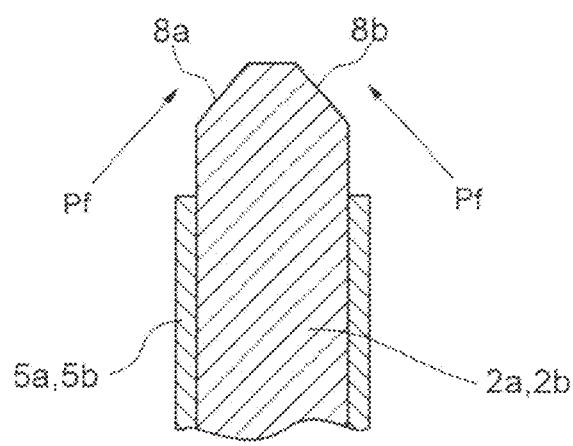
FIG. 1B is an enlarged cross-sectional diagram of a part thereof.
Figure 2:
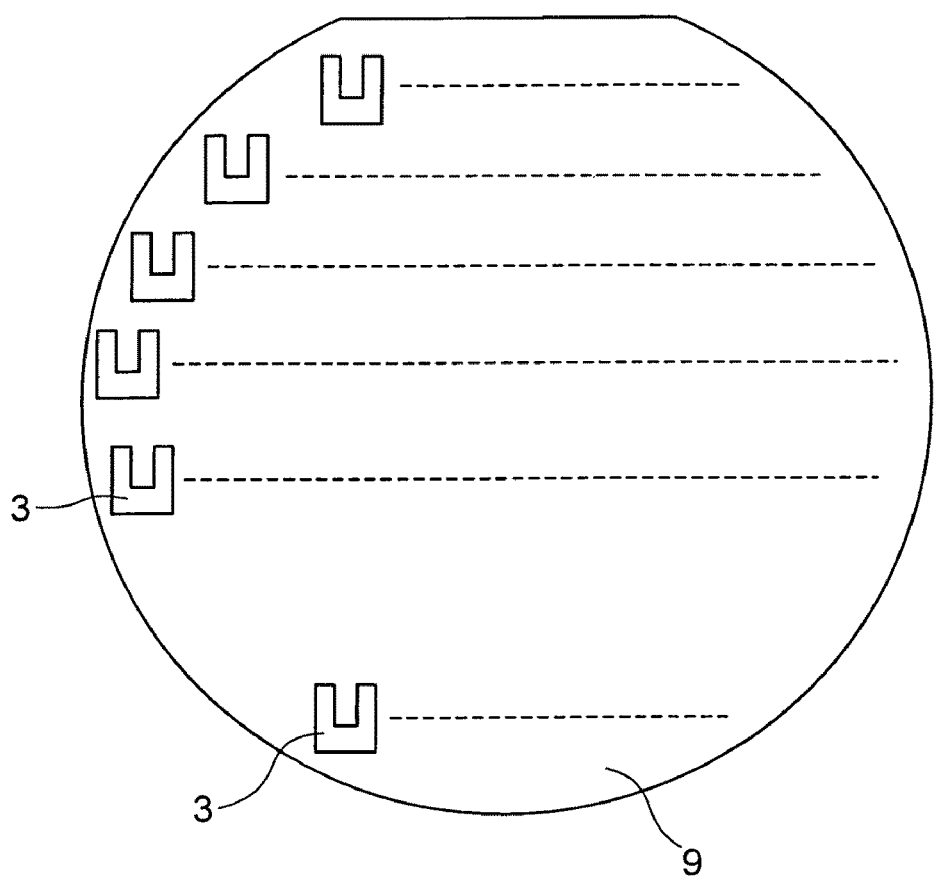
FIG. 2 is a diagram showing an embodiment of a method of frequency adjustment of the tuning-fork type resonator of the present invention, and is a front view of a quartz crystal wafer on which tuning-fork shaped quartz crystal pieces 3 are assembled integrally.
Figure 3:
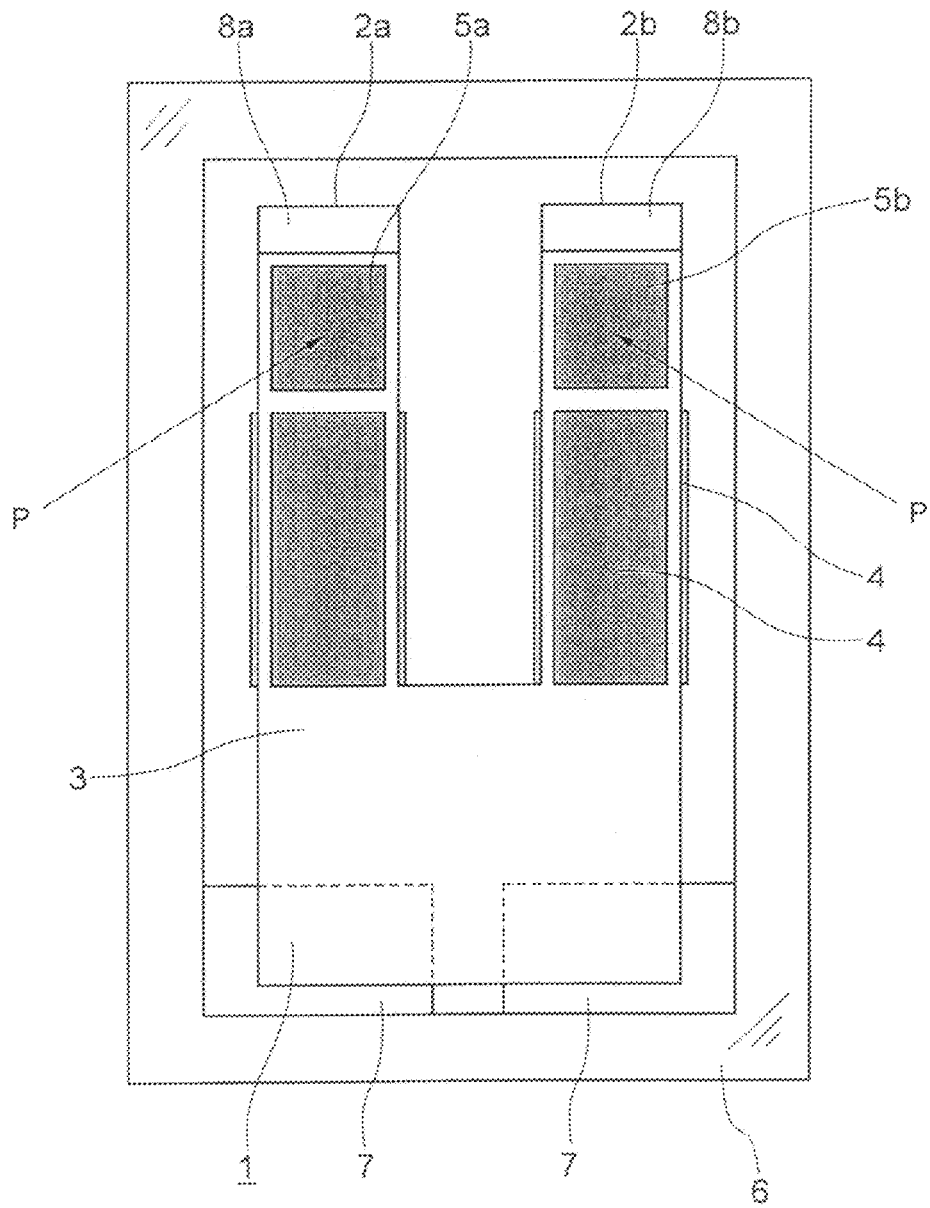
FIG. 3 is a diagram showing an embodiment of the method of frequency adjustment of the tuning-fork type resonator of the present invention, and is a plan view of the tuning-fork type resonator viewed with its lid removed.
Figure 4:
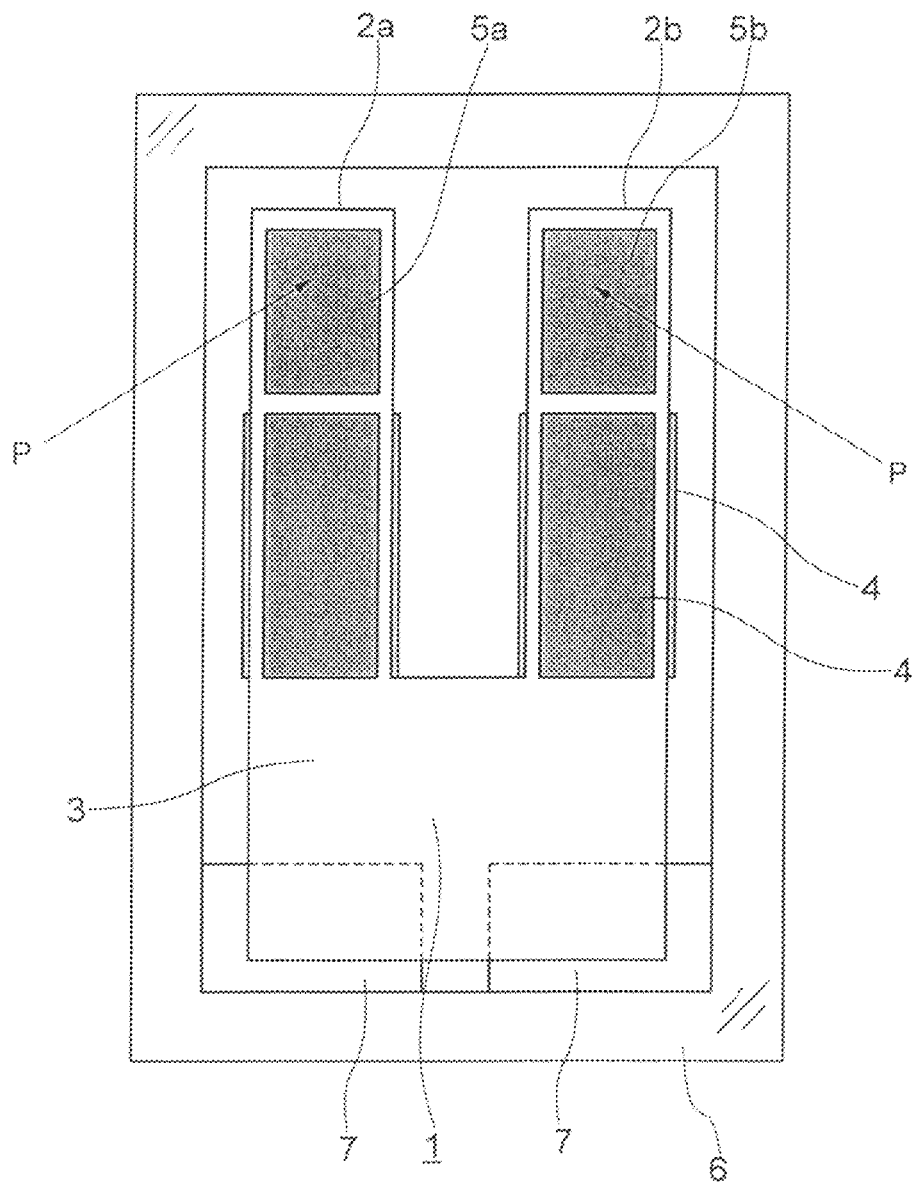
FIG. 4 is a plan view of an example of a conventional tuning-fork type resonator viewed with its lid removed.
Figure 5A:
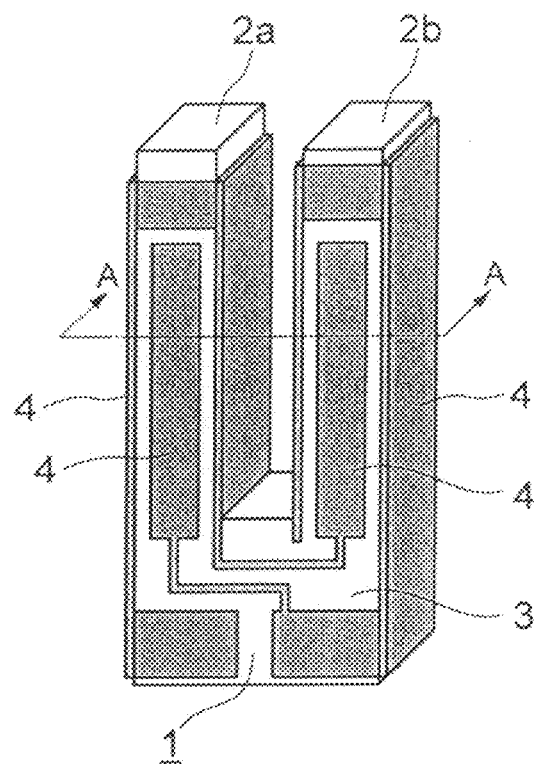
FIG. 5A is a perspective view thereof with electrode wiring added.
Figure 5B:
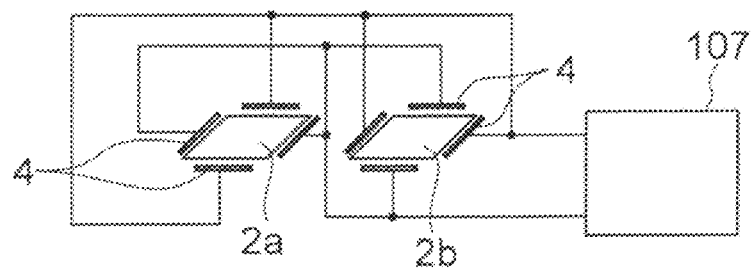
FIG. 5B is a cross-sectional diagram through line A-A of FIG. 5A.
Figure 6:
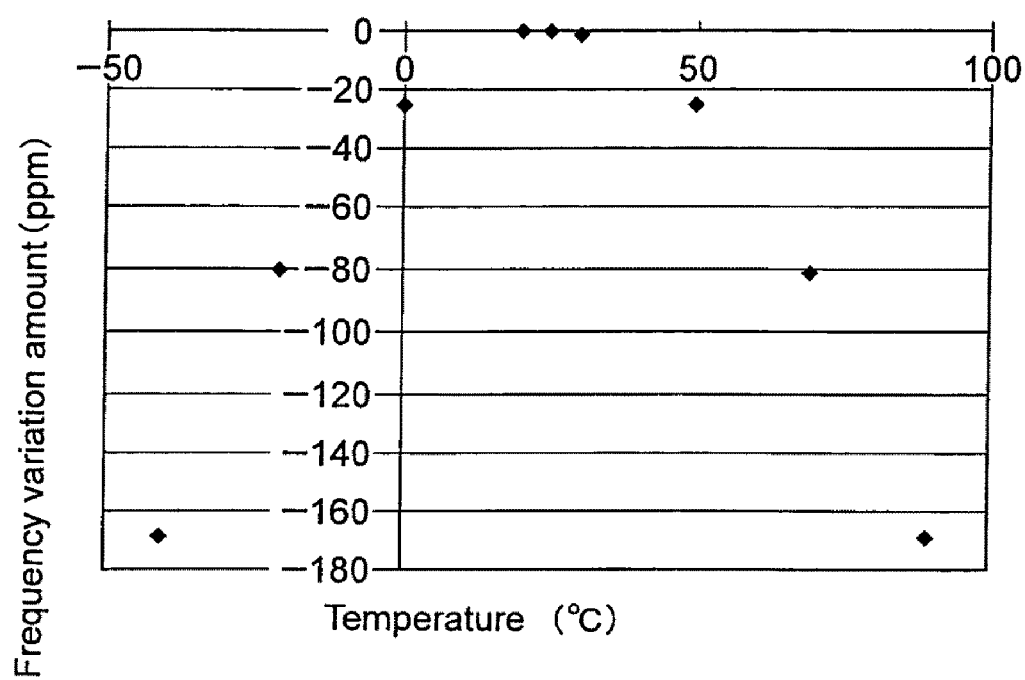
FIG. 6 is a diagram showing a typical example of the frequency-temperature characteristics of a tuning-fork type resonator.

FIG. 1 to FIG. 3 are diagrams showing frequency adjustment steps of a tuning-fork type resonator according to an embodiment of the present invention. FIG. 1A is a front view of a tuning-fork shaped quartz crystal piece 3. FIG. 1B is a partially enlarged cross-sectional diagram. FIG. 2 is a front view, where some of the quartz crystal pieces are omitted, of a quartz crystal wafer on which the tuning-fork shaped quartz crystal pieces 3 are integrated. FIG. 3 is a plan view of the tuning-fork type resonator with its lid removed.

As shown in FIG. 1A, a tuning-fork type resonator of the present invention is provided with a tuning-fork shaped quartz crystal piece 3 with a pair of tuning fork arms 2a and 2b extending from a tuning fork base 1. The tuning fork arms 2a and 2b have excitation electrodes 4 on each of their four surfaces excluding the distal end surfaces, and are connected such that the electric potentials between each of the two main surfaces and between each of the two side surfaces in the respective tuning fork arms 2a and 2b are the same, those between the two side surfaces and the two main surfaces are reversed, and the electric potentials between the two main surfaces and between the two side surfaces of the tuning fork arms 2a and 2b are reversed relative to each other.

Excitation electrodes 4 with the same electric potentials are connected together, and a pair of electrodes extends to the bottom of the main surfaces of the tuning fork base 1. The metal films 5a and 5b for frequency adjustment are formed on the main surfaces on the tip sides of the tuning fork arms 2a and 2b. The metal films 5a and 5b here are formed lower than those of the conventional example, and exposed substrate sections 8a and 8b are provided above the main surfaces on the tip side. These, including the excitation electrodes 4 and the like, are outline machined using photolithography, for example, and many tuning-fork shaped quartz crystal pieces 3 are connected with the quartz crystal wafer 9 integrally and collectively (refer to FIG. 2). The metal films 5a and 5b may be extended to the tips of the tuning fork arms 2a and 2b.

A method of frequency adjustment of a tuning-fork type resonator of the present invention comprises a first frequency adjustment step and a second frequency adjustment step. Firstly, in the first frequency adjustment step, a femtosecond laser (ultrashort pulse laser) Pf is irradiated from the two main surfaces on the tip side, which are the exposed substrate sections 8a and 8b of the tuning fork arms 2a and 2b of each of the tuning-fork shaped quartz crystal pieces 3, toward the distal end surfaces (head surfaces), or from the distal end surfaces to the two main surfaces on the tip side in a quartz crystal wafer 9 state (see FIG. 2). As a result, inclined surfaces extending from the two side surfaces on the tip side of the tuning fork arms 2a and 2b, which are above the metal films 5a and 5b, to the distal end surfaces are formed for rough adjustment of the oscillation frequency.

Figure 7A:
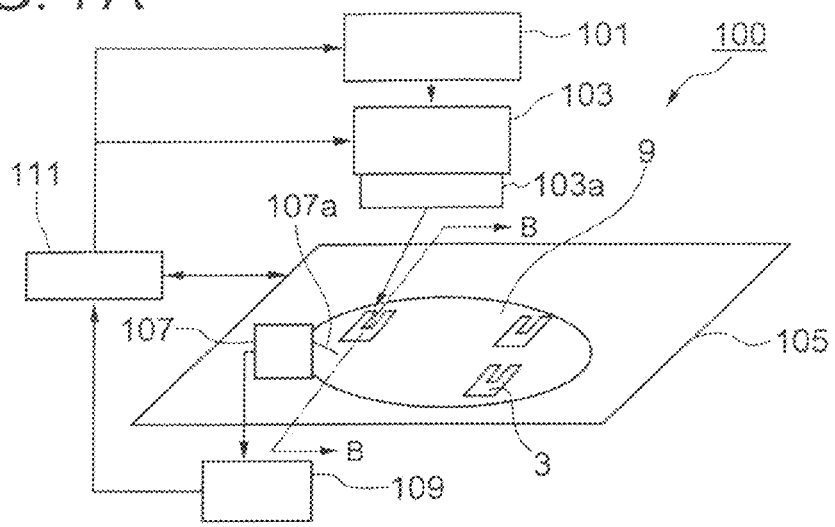
FIG. 7A is a block diagram showing an outline of an experimental apparatus 100 used in the present invention.
Figure 7B:
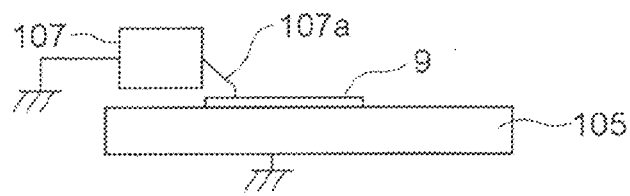
FIG. 7B is a schematic diagram showing the arrangement of frequency measurement for a wafer.
Figure 7C:
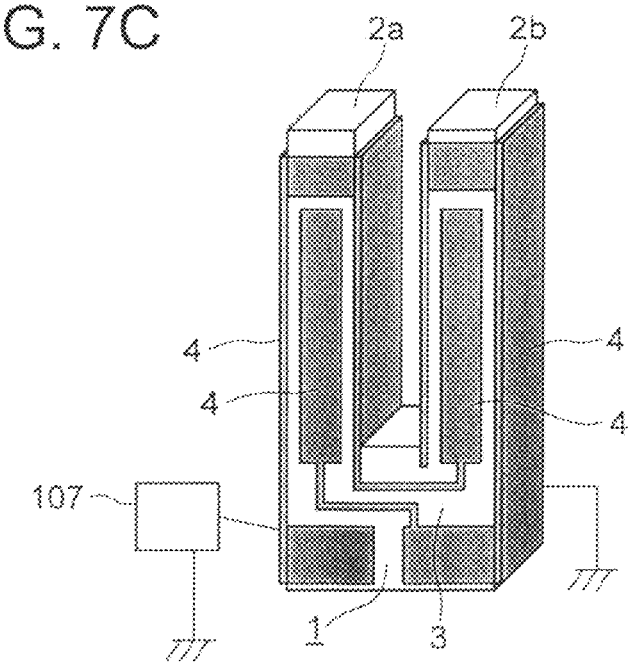
FIG. 7C is a schematic diagram showing the arrangement of probing with respect to the tuning-fork type resonator.

In this experiment, a quartz crystal wafer with a thickness of 120 μm was used. Furthermore, the irradiation conditions of the femtosecond laser were that the pulse width was approximately 70 fs, the power was 30 μJ/pulse, and the pulse repetition frequency was 1000 Hz. Needless to say, this is just an example. Moreover, an experimental apparatus was used with the construction described below using FIG. 7A to FIG. 7C. FIG. 7A is a block diagram showing an outline of an experimental apparatus 100. FIG. 7B is a schematic diagram showing the arrangement of frequency measurement for a wafer. FIG. 7C is a diagram showing the arrangement of probing with respect to the tuning-fork type resonator.

The experimental apparatus 100 as shown in FIG. 7A and FIG. 7B, is provided with a femtosecond laser optical source 101, a galvanic mirror 103, an XYZ stage 105, an oscillation circuit 107 having a probe pin 107a, a frequency measuring instrument 109, and a control unit 111.

The light source 101 emits a desired femtosecond laser beam. The galvanic mirror 103 scans the femtosecond laser light onto the tips of the arm parts of the tuning-fork type resonator as specified to cut the quartz crystal. Furthermore, the construction is such that an $f_\theta$ lens 103a is provided on the front of the galvanic mirror 103 to adjust the focus of the femtosecond laser beam. The XYZ stage 105 can hold the quartz crystal wafer 9, and can move the quartz crystal wafer 9 in the X, Y, and Z directions arbitrarily. The oscillation circuit 107 probes the tuning-fork shaped quartz crystal pieces 3 on the quartz crystal wafer 9 sequentially, causing each tuning fork piece to oscillate, and it also transmits the frequency signals of the tuning fork pieces to the frequency measuring instrument 109. The oscillation circuit 107 is constructed such that it can move upward and downward in the Z direction with respect to the wafer. The frequency measuring instrument 109 reads the frequency of the tuning fork pieces via a signal of the oscillation circuit 107. The control unit 111 controls each of the above-described elements 103 to 109. When executing frequency adjustment, preferably the femtosecond laser is irradiated continuously while oscillating the crystal with the oscillation circuit, and while executing frequency measurement, and frequency adjustment of the tuning forks is preferably performed while confirming that the frequency is within the target range.

Needless to say, the construction of the experimental apparatus 100 is just an example. In the case of the experimental apparatus at this time, the laser beam was scanned using a galvanic mirror. However, the arrangement may be such that the beam is only passed through an objective lens, no scanning being performed, the XYZ stage is jogged, and the quartz crystal wafer is processed using the laser beam.

Moreover, in this experiment, laser irradiation of the front and back of the quartz crystal wafer 9 was performed by an experimenter reversing the quartz crystal wafer.

In this experiment, exposed substrate sections 8a and 8b were provided on the tuning-fork shaped quartz crystal pieces 3. The exposed substrate sections 8a and 8b are not essential. However, since this experiment proved that the laser beam machining was easier (cutting the quartz crystal was easier) in the case where the exposed substrate sections 8a and 8b were provided and the femtosecond laser was irradiated on them, it is preferable to provide the exposed substrate sections 8a and 8b, and irradiate the femtosecond laser on them.

Next, in the second frequency adjustment step, as described above, each of the tuning-fork shaped quartz crystal pieces 3 is separated from the quartz crystal wafer 9, and the tuning-fork shaped quartz crystal pieces 3 are housed in a surface mount housing (enclosure) 6. The tuning fork base 1 of each tuning-fork shaped quartz crystal piece 3 is fixed to the inner wall pad sections 7 of the surface mount housing (enclosure) 6. In this embodiment, similarly to the first frequency adjustment step, the metal films 5a and 5b on the tips of the main surfaces of the tuning forks are removed on each of the tuning-fork shaped quartz crystal pieces 3 using a femtosecond laser for fine adjustment of the oscillation frequencies of the tuning-fork type resonators.

According to such a method of frequency adjustment, since the frequency is adjusted roughly in the first frequency adjustment step using a femtosecond laser Pf, there is no temperature increase at the time of the frequency adjustment, so that adjustment is possible within the specification at room temperature. In this case, the amount of frequency adjustment in the rough adjustment is generally several thousands to several tens of thousands of ppm, which is high. However, since the adjustment is by a femtosecond laser, the adjustment is performed in a state in which there is no substantial temperature effect, so that the deviation (amount out of specification) from the specification can be minimized.

Since the adjustment of the oscillation frequency of a tuning-fork type resonator of the present invention is performed in a state in which the tuning-fork shaped quartz crystal pieces 3 are connected on the quartz crystal wafer 9, it is easy to ensure the locational accuracy, the levelness of the processed part, and the like, of each tuning-fork shaped quartz crystal piece 3, which makes for excellent work efficiency. Moreover, in the present invention, since the cutting is performed from the two main surface sides of the tuning fork arms 2a and 2b, it is possible to maintain the symmetrical property of the tuning-fork shaped quartz crystal piece 3, and thus maintain excellent tuning fork oscillation. Furthermore, compared with the case where the cutting is performed from one surface of the tuning-fork shaped quartz crystal piece 3, it is possible to increase the amount cut off the quartz crystal. As a result, the frequency adjustment range can be widened, and the amount of frequency variation per machining time can be increased. That is, the machining time can be shortened.

Moreover, since the tuning fork arms are cut by irradiating the femtosecond laser (ultrashort pulse laser) Pf diagonally with respect to the main surfaces of the tuning fork arms, the femtosecond laser Pf permeates the tuning fork arms, so there is no damage due to the laser energy.

Furthermore, since the separated tuning-fork shaped quartz crystal pieces 3 are housed in the surface mount housing (enclosure) 6 after the first frequency adjustment step (rough adjustment), and fine adjustment is performed in the second frequency adjustment step, it is possible to reduce the frequency adjustment amount at the time of the fine adjustment. The adjustment amount in this case is several tens to several hundreds of ppm for example. Even if the adjustment amount is large, since a femtosecond laser is used, the amount of heat generated by the laser Pf becomes small, so that the oscillation frequency can be adjusted within the specification at room temperature.

In the above-described embodiment of the present invention, the femtosecond laser is irradiated from the two main surface sides of the tuning fork arms 2a and 2b in the first frequency adjustment step. However, the femtosecond laser may be irradiated from only one main surface side of the tuning fork arms 2a and 2b. In this case, it is possible to simplify the construction arrangement and the like of the femtosecond laser apparatus. Moreover, the metal films 5a and 5b are removed using the femtosecond laser in the second frequency adjustment step. However, instead of the metal films 5a and 5b, the quartz crystal itself may be cut. As a result, it is possible to omit the process of forming the metal films 5a and 5b on the tips of the tuning fork.

Furthermore, in the present invention, the tuning fork arms 2a and 2b are cut from the two main surface sides in the first frequency adjustment step using the femtosecond laser. However, they may be cut from the side surface sides of the tuning fork arms. Essentially, provided the inclined surfaces are formed spanning from the outer peripheral surfaces surrounding the tuning fork arms 2a and 2b to the distal end surfaces, a similar effect is shown. The second frequency adjustment step may be performed using a YAG laser or the like similarly to a conventional one, or furthermore, may be performed using an ion milling process.

INDUSTRIAL APPLICABILITY

The method of frequency adjustment of a tuning-fork type crystal oscillator of the present invention can be widely used for frequency adjustment of other types of crystal oscillators.

The invention claimed is:

1. A method of frequency adjustment of a tuning-fork type crystal resonator having a tuning-fork shaped piece of quartz crystal in which a pair of tuning fork arms extend from a tuning fork base, comprising a first frequency adjustment step for adjusting an oscillation frequency by forming inclined surfaces spanning from outer peripheral surfaces surrounding said pair of tuning fork arms toward distal end surfaces, by using a femtosecond laser irradiated in a direction from said outer peripheral surfaces toward said distal end surfaces, or in a direction from said distal end surfaces toward said outer peripheral surfaces, wherein said tuning-fork shaped quartz crystal piece has an adjustment metal film on a main surface on a tip side of said tuning fork arm, and there is provided a second frequency adjustment step for removing part of said adjustment metal film using a laser, after said first frequency adjustment step using said femtosecond laser, wherein the laser used in said second frequency adjustment step is a femtosecond laser with lower power than the laser power of said first frequency adjustment step.

2. A method of frequency adjustment of a tuning-fork type crystal resonator having a tuning-fork shaped piece of quartz crystal in which a pair of tuning fork arms extend from a tuning fork base, comprising a first frequency adjustment step for adjusting an oscillation frequency by forming inclined surfaces spanning from outer peripheral surfaces surrounding said pair of tuning fork arms toward distal end surfaces, by using a femtosecond laser irradiated in a direction from said outer peripheral surfaces toward said distal end surfaces, or in a direction from said distal end surfaces toward said outer peripheral surfaces, wherein said tuning-fork shaped quartz crystal piece has an adjustment metal film on a main surface on a tip side of said tuning fork arm, and there is provided a second frequency adjustment step for removing part of said adjustment metal film using a laser, after said first frequency adjustment step using said femtosecond laser, wherein said second frequency adjustment step is performed by removing a metal film formed beforehand on the tips of the tuning fork, by iron milling.

3. A method of frequency adjustment of a tuning-fork type crystal resonator having a tuning-fork shaped piece of quartz crystal in which a pair of tuning fork arms extend from a tuning fork base, comprising a first frequency adjustment step for adjusting an oscillation frequency by forming inclined surfaces spanning from outer peripheral surfaces surrounding said pair of tuning fork arms toward distal end surfaces, by using a femtosecond laser irradiated in a direction from said outer peripheral surfaces toward said distal end surfaces, or in a direction from said distal end surfaces toward said outer peripheral surfaces, wherein said first frequency adjustment step irradiates said femtosecond laser continuously while executing frequency measurements of said tuning-fork shaped piece of quartz crystal.

4. A method of frequency adjustment of a tuning-fork type quartz crystal resonator according to claim 3, wherein an incident angle with respect to a main face of said tuning fork, of said femtosecond laser that forms said inclined faces is 30 to 70°.

\* \* \* \* \*